United States Patent
Chamarti et al.

(10) Patent No.: US 9,075,091 B2
(45) Date of Patent: *Jul. 7, 2015

(54) SENSOR DEVICES AND METHODS FOR USE IN SENSING CURRENT THROUGH A CONDUCTOR

(75) Inventors: Subramanyam Satyasurya Chamarti, Atlanta, GA (US); Steven Lee Bietz, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/229,002

(22) Filed: Sep. 9, 2011

(65) Prior Publication Data

US 2013/0063131 A1    Mar. 14, 2013

(51) Int. Cl.
    *G01R 33/12*     (2006.01)
    *G01R 15/18*     (2006.01)

(52) U.S. Cl.
    CPC ................... *G01R 15/181* (2013.01)

(58) Field of Classification Search
    CPC . G01R 33/1215; G01R 9/0092; G01R 15/181
    USPC ....................... 324/228, 76.11, 654
    See application file for complete search history.

(56) References Cited

U.S. PATENT DOCUMENTS

| | | |
|---|---|---|
| 3,340,353 A | 9/1967 | Mildner |
| 4,611,191 A | 9/1986 | Souchere |
| 4,616,176 A | 10/1986 | Mercure et al. |
| 5,414,400 A | 5/1995 | Gris et al. |
| 5,442,280 A | 8/1995 | Baudart |
| 5,461,309 A | 10/1995 | Baudart |
| 5,982,265 A | 11/1999 | Von Skarczinski et al. |
| 6,094,044 A | 7/2000 | Kustera et al. |
| 6,313,623 B1 | 11/2001 | Kojovic et al. |
| 6,417,661 B1 | 7/2002 | Berkcan et al. |
| 6,521,695 B1 | 2/2003 | Peruzzotti et al. |
| 6,614,218 B1 | 9/2003 | Ray |
| 6,731,193 B2 | 5/2004 | Meier et al. |
| 6,822,547 B2 | 11/2004 | Saito et al. |
| 7,106,162 B2 | 9/2006 | Saito |
| 7,227,441 B2 | 6/2007 | Skendzic et al. |

(Continued)

FOREIGN PATENT DOCUMENTS

| | | |
|---|---|---|
| CN | 201465698 U | 5/2010 |
| WO | 2009139521 A1 | 11/2009 |

OTHER PUBLICATIONS

Co-pending U.S. Appl. No. 13/228,924, filed Sep. 9, 2011, entitled Sensor Devices and Methods for Use in Sensing Current Through a Conductor, by Chamarti et al.

(Continued)

*Primary Examiner* — Reena Aurora
(74) *Attorney, Agent, or Firm* — Armstrong Teasdale LLP

(57) ABSTRACT

Sensor devices and related methods disclosed. One example sensor device includes a non-magnetic substrate defining an aperture structured to receive a conductor therein, a coil including a plurality of coil turns wound about at least a portion of the substrate, a first shield between the substrate and the plurality of coil turns, a second shield disposed proximate to the plurality of coil turns, opposite the first shield, such that the plurality of coil turns is disposed between the first shield and the second shield, and a filter element coupled to at least one of the first and second shields.

19 Claims, 6 Drawing Sheets

(56) References Cited

U.S. PATENT DOCUMENTS

| | | |
|---|---|---|
| 7,253,603 B2 | 8/2007 | Kovanko et al. |
| 7,474,192 B2 | 1/2009 | Skendzic et al. |
| 7,538,541 B2 | 5/2009 | Kojovic |
| 2003/0112000 A1 | 6/2003 | Sorenson, Jr. |
| 2004/0257061 A1 | 12/2004 | George de Buda |
| 2005/0248430 A1 | 11/2005 | Dupraz et al. |
| 2005/0253573 A1 | 11/2005 | Budillon et al. |
| 2006/0220774 A1 | 10/2006 | Skendzic |
| 2007/0152651 A1 | 7/2007 | Shiokawa et al. |
| 2007/0285089 A1 | 12/2007 | Ibuki et al. |
| 2007/0290695 A1 | 12/2007 | Mahon |
| 2008/0007249 A1 | 1/2008 | Wilkerson et al. |
| 2008/0036448 A1 | 2/2008 | Kovach et al. |
| 2008/0079418 A1 | 4/2008 | Rea et al. |
| 2008/0106253 A1 | 5/2008 | Kojovic |
| 2008/0211484 A1 | 9/2008 | Howell et al. |
| 2008/0303511 A1 | 12/2008 | Grno |
| 2010/0013460 A1 | 1/2010 | Ermisch et al. |
| 2011/0025304 A1 | 2/2011 | Lint et al. |
| 2011/0025305 A1 | 2/2011 | Lint et al. |
| 2011/0043190 A1 | 2/2011 | Farr |
| 2011/0148561 A1 | 6/2011 | Lint et al. |
| 2011/0204879 A1 | 8/2011 | Peretto |
| 2012/0098519 A1 | 4/2012 | Juds et al. |
| 2013/0043967 A1 | 2/2013 | Rouaud et al. |

OTHER PUBLICATIONS

Co-pending U.S. Appl. No. 13/229,038, filed Sep. 9, 2011, entitled Sensor Devices and Methods for Use in Sensing Current Through a Conductor, by Chamarti et al.

Co-pending U.S. Appl. No. 13/228,968, filed Sep. 9, 2011, entitled Sensor Devices and Methods for Use in Sensing Current Through a Conductor, by Chamarti et al.

Synthetic Resin, available at http://en.wikipedia.org/wiki/Synthetic_resin, Nov. 1, 2013.

Bakelite, available at http://en.wikipedia.orglwiki/Bakelite, Nov. 1, 2013.

Dielectric Constants of Various Materials Table, available at http://www.csgnetwork.com/dieconstantstable.html, Nov. 1, 2013.

Thermoplastic Resin, available at http://www.trivenichemical.com/resin4.html, Nov. 1, 2013.

Clamp-On Weather Proof Rogowski Coil, available at http://www.taehwatrans.com/bbs/board.php? bo_table=product_02&wr_id=10, Nov. 1, 2013.

Search Report issued in connection with EP Application No. 12180314.2, Nov. 29, 2012.

SENSOR DEVICES AND METHODS FOR USE IN SENSING CURRENT THROUGH A CONDUCTOR

BACKGROUND OF THE INVENTION

The field of the invention relates generally to sensor devices and methods and, more particularly, sensing current through a conductor.

At least some known utility meters are used to measure electricity supplied from a power source to a user. To enable an amount of energy supplied to a user to be accurately measured, utility meters often include one or more sensor devices to sense current flowing through a conductor between the power source and the user. When included in a utility meter, the sensor device is intended to function accurately over an operating range of voltages and/or currents.

Various types of known current sensor devices are used in utility meters. For example, at least some known transformer sensor devices include a magnet core with magnet wire wound thereon to sense current flowing through a conductor. Current sensor devices including transformers, however, are generally known to be bulky and expensive. Another example of a known current sensor device is a Rogowski coil. Rogowski coils include a coil and are generally smaller than transformer sensor devices. However, Rogowski coils are known to provide only limited accuracy during low current and/or high current conditions over a range of voltages. As a result, during manufacturing, utility meters with known Rogowski coils are often subjected to multiple calibration processes to minimize the effects of these inaccuracies. Although these repeated calibration processes may reduce the inaccuracies of such sensor devices, the processes also increase manufacturing times and costs of the utility meters.

BRIEF DESCRIPTION OF THE INVENTION

In one aspect, a sensor device for use in sensing current through a conductor is provided. The sensor device includes a non-magnetic substrate defining an aperture structured to receive a conductor therein, a coil including a plurality of coil turns wound about at least a portion of the substrate, a first shield between the substrate and the plurality of coil turns, a second shield disposed proximate to the plurality of coil turns, opposite the first shield, such that the plurality of coil turns is disposed between the first shield and the second shield, and a filter element coupled to at least one of the first and second shields.

In another aspect, a utility meter for use in transmitting electrical energy from a power source to a user is provided. The utility meter includes a conductor and a sensor device disposed at least partially around the conductor. The sensor device includes a non-magnetic substrate defining an aperture, a coil including a plurality of coil turns wound about at least a portion of the non-magnetic substrate, a first shield between each of the substrate and the plurality of coil turns, a second shield proximate to the plurality of coil turns, opposite the first shield, and a filter element coupled between the coil and at least one of the first and second shields.

In yet another aspect, a method of fabricating a sensor device for sensing current through a conductor is provided. The method includes providing a sensor device including a non-magnetic substrate defining an aperture, a coil having a plurality of coil turns about at least a portion of the non-magnetic substrate, a first shield disposed between each of the substrate and the plurality of coil turns, and a second shield disposed proximate to the plurality of coil turns, opposite the first shield. The method includes coupling a first lead wire to at least one of the first shield and the second shield, coupling a second lead wire to a first end of the coil, coupling a third lead wire to a second end of the coil, and forming a twisted set of lead wires from the first, second, and third lead wires.

DETAILED DESCRIPTION OF THE INVENTION

Figure 1:
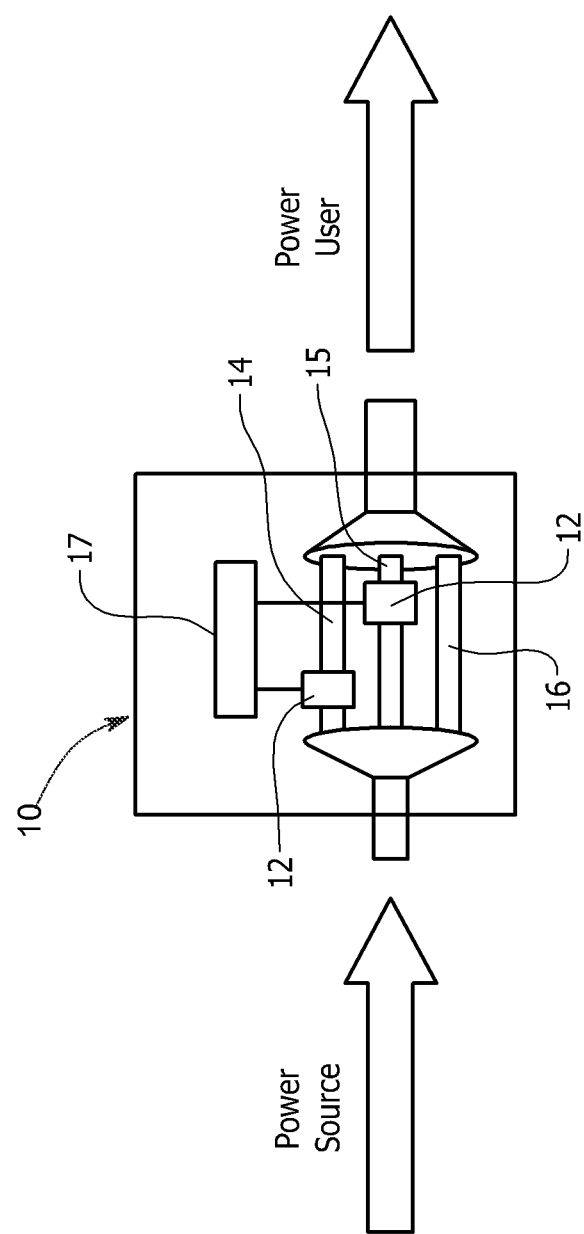
FIG. 1 is a block diagram of an exemplary utility meter including an exemplary sensor device.

FIG. 1 illustrates a block diagram of an exemplary utility meter 10. In the exemplary embodiment, utility meter 10 includes a sensor device 12, a conductor 14, and a meter control board 17 coupled to sensor device 12. Conductor 14 may include a bus bar, multi-strand wire, single-strand wire, cable, or other suitable conductor to transmit electricity from a power source to a power user. The power source may include, without limitation, an electrical grid and/or a power generator system, such as a gas turbine engine, a hydroelectric turbine, a wind turbine, a solar panel, and/or another suitable generation and/or transmission system. The power source may also include a smart-grid in communication with meter control board 17. A user may include, without limitation, a residential user, a commercial user and/or any other user of electricity at any level. Sensor device 12 is coupled to conductor 14 to sense current flowing through conductor 14. Sensor device 12 provides a signal representative of sensed current to meter control board 17. Based on the signal received from sensor device 12, meter control board 17 determines an amount of electricity transmitted through conductor 14 from the power source to the user over time.

Because a charge may be incurred for electricity transferred from the power source to the user, it is desirable that sensor device 12 is highly accurate to ensure the user is charged substantially only for electricity received, rather than being charged for substantially all the electricity transmitted to the user by the operator of the power source.

In this exemplary embodiment, utility meter 10 further includes conductors 15 and 16 and another sensor device 12 coupled to conductor 15. It should be appreciated that any number of conductors and/or sensor devices (e.g., one, three, six, etc.) may be used in other utility meter embodiments. Moreover, it should be appreciated that sensor device 12 is not limited to only being used within utility meter 10, but may be utilized in virtually any application to sense current through a conductor, such as power generation applications, utility applications, automotive applications, appliance applications, telecommunication applications, etc.

Figure 2:
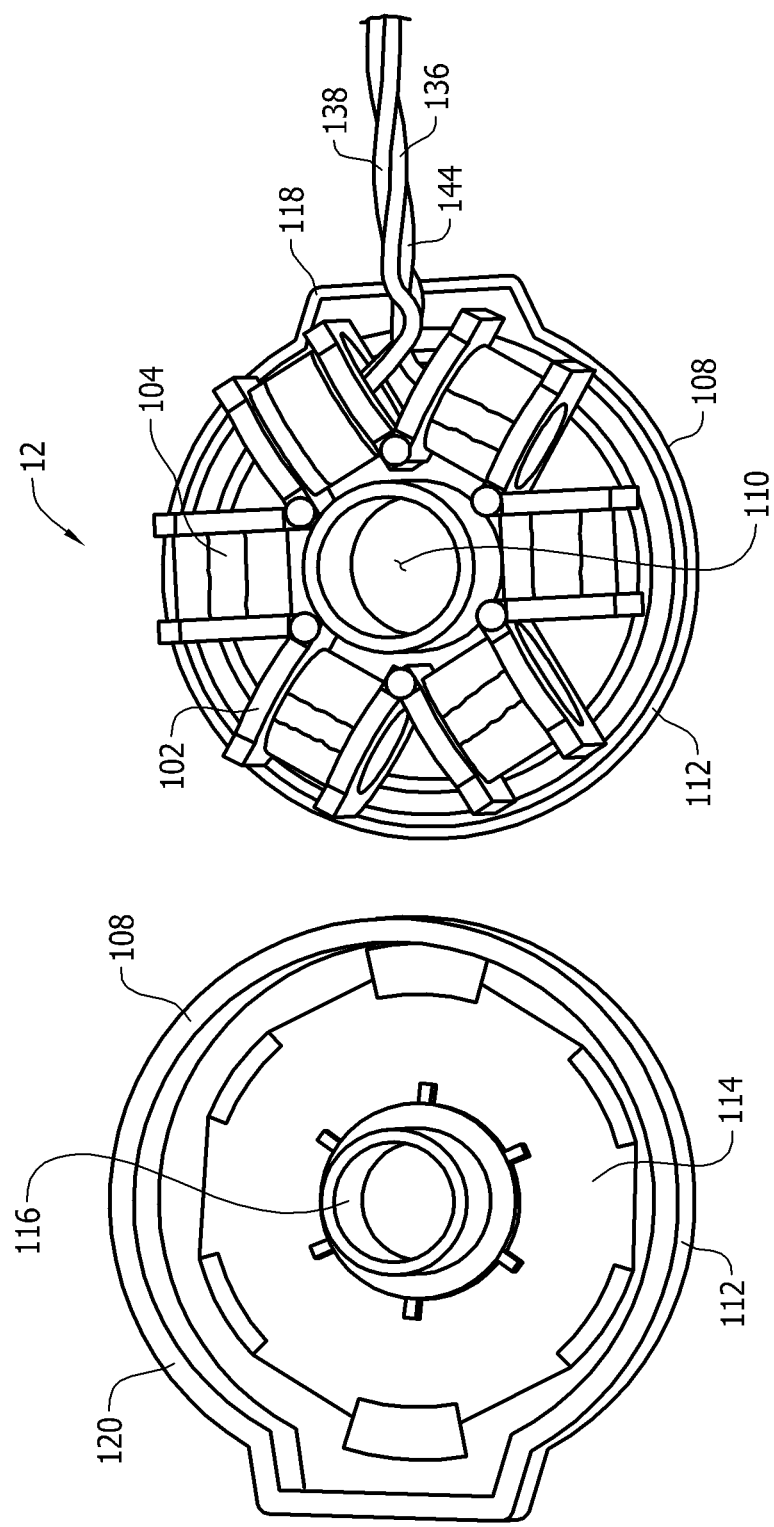
FIG. 2 is a partially disassembled view of the sensor device shown in FIG. 1.

FIG. 2 is a partially disassembled view of exemplary sensor device 12. In the exemplary embodiment, sensor device 12 includes a substrate 102, a coil 104 including a plurality of turns wound about substrate 102, and a dielectric material 108. Coil 104 includes an aperture 110 defined therein, which is structured (e.g., by size, orientation, and/or shape, etc.) to receive conductor 14 therein. Dielectric material 108 is positioned adjacent to coil 104 and at least partially within aperture 110. More specifically, in this embodiment, dielectric material 108 is positioned at least partially between coil 104 and conductor 14, when conductor 14 is positioned through aperture 110.

Dielectric material 108 may include one or more dielectric materials having a variety of characteristics configured in a variety of ways. For example, dielectric material 108 may have a dielectric constant equal to or greater than about 3.0 at about 10-1000 Hz. In some embodiments, the dielectric constant may be greater than about 3.5, about 4.0, about 5.0, about 8.0, about 12.0, about 17.0 and/or any other suitable dielectric constant. In one exemplary embodiment, the dielectric constant of dielectric material 108 may be approximately equal to about 3.5. In another exemplary embodiment, the dielectric constant of dielectric material 108 may be approximately equal to about 6.0.

Further, dielectric material 108 has at least one thickness, and may have various thicknesses. In the exemplary embodiment, dielectric material 108 positioned adjacent to coil 104 and at least partially within aperture 110 has a thickness of about 3.0 millimeters. Also, in the same embodiment, dielectric material 108 positioned adjacent to coil 104 but opposite aperture 110 has a thickness of about 1.2 millimeters. It should be appreciated that dielectric material 108 may have any thickness or thicknesses, that enables sensor device 12 to function as described herein. Generally, thickness of dielectric material 108 is selected, at least partially based on the dielectric constant of dielectric material 108, the proximity of coil 104 to one or more conductors 14, 15 and 16, and/or space available in an intended environment for installation of the sensor device, etc. In some example embodiments, the thickness of dielectric material 108 may range from about 1.0 millimeter to about 3.0 centimeters, or greater in still other embodiments.

In the exemplary embodiment, dielectric material 108 may be fabricated from one or more of several types of material, such as, without limitation, plastic materials, thermoplastic materials, thermoset materials, ceramic materials, metallic materials, wood materials, clay materials, organic materials, any mixture thereof, and/or other materials suitable to perform as described herein. In the exemplary embodiment of FIG. 2, dielectric material 108 includes a PBT thermoplastics material commercially available from a Valox® family of materials. In various embodiments, dielectric material 108 includes one or more of, without limitation, Kapton® tape, a polyvinylidene fluoride (PVDF) material, a room temperature vulcanized silicone (RTV) polymer, a PBT thermoplastics material commercially available from a Valox® family of materials (e.g., Valox® 365 or Valox® V9561), a polyethylene terephthalate (PET) thermoplastic material from the Rynite® family of materials, a PPS thermoplastic material commercially available from the Ryton® family of materials, a PPS thermoplastic material commercially available from the Primef® family of materials, a nylon thermoplastic material commercially available from the Zytel®, Stanyl®, or RTP®, families of materials, a LCP thermoplastic material (e.g., Sumitomo® E5008L and E4008L materials), etc. One or more types of dielectric material 108 may be selected based on dielectric constant, suitability for one or more manufacturing techniques, dimensional stability, cost, moldability, workability, rigidity, and/or other characteristic of the material(s). In at least one example, dielectric material 108 is selected at least partially based on the variability of its dielectric constant over temperature.

Figure 3:
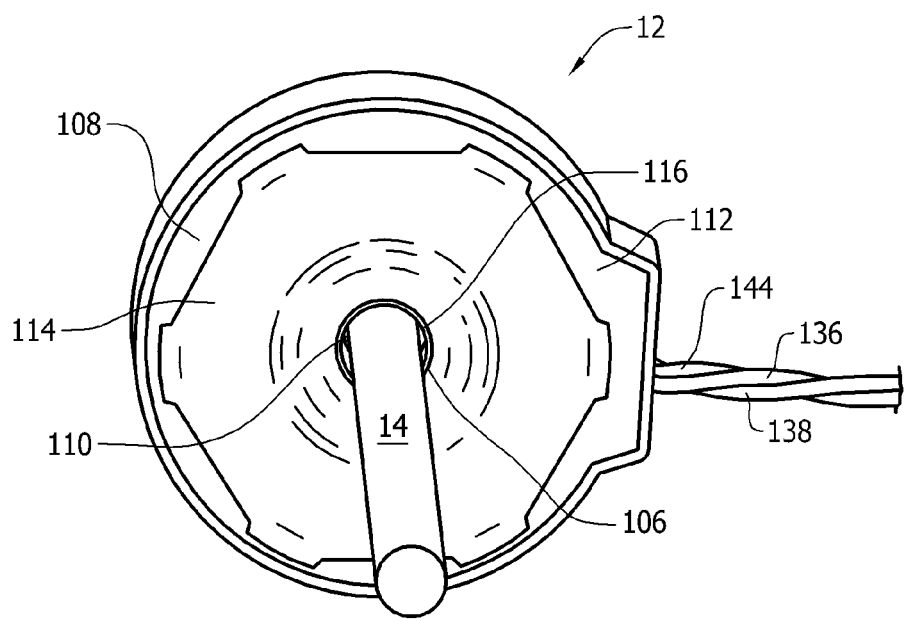
FIG. 3 is a perspective view of the sensor device shown in FIG. 1.
Figure 4:
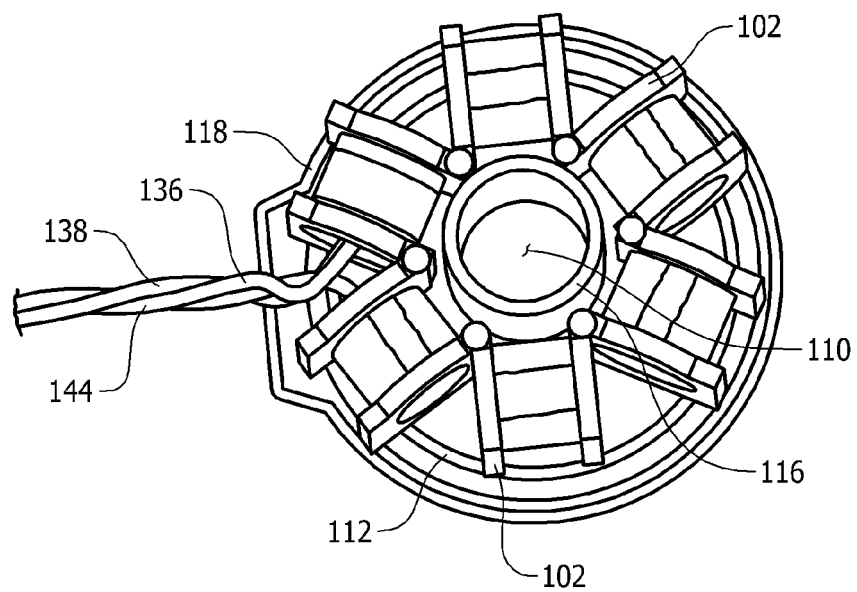
FIG. 4 is a plan view of the sensor device shown in FIG. 1.

FIG. 3 is a perspective view of sensor device 12 (shown as assembled) with conductor 14 extending through aperture 110. As described above, sensor device 12 senses current flow through conductor 14. Specifically, when current flows through conductor 14, a current is induced in coil 104. The amount of current induced in coil 104 is representative of the amount of current flowing through conductor 14. When sensor device 12 is positioned around conductor 14, coil 104 is spaced a distance from conductor 14. Accordingly, capacitance exists between coil 104 and conductor 14. The capacitance may affect the accuracy of sensor device 12 at different operating voltages (e.g., a range from about 30V to about 277V). In the exemplary embodiment, dielectric material 108 is positioned within at least a portion of an air-gap 106 defined between coil 104 and conductor 14. As a result, dielectric material 108 affects and/or facilitates a reduction of the capacitance between coil 104 and conductor 14, while permitting coil 104 and conductor 14 to remain in close proximity.

The reduction in capacitance enables sensor device 12 to sense current flowing through conductor 14 with improved accuracy, as compared to known Rogowski coils or other air-gap coils. More specifically, by reducing capacitance coupling between coil 104 and conductor 14, the sensitivity to operating voltage is reduced. As a result, consistent current sensing is provided at different operating voltages across a range of different currents, including high and low currents. Accordingly, when sensor device 12 is included in utility meter 10, one or more processes necessary for calibrating known sensor devices may be omitted. Specifically, in the exemplary embodiment, the consistency of sensor device 12 to accurately detect current across different operating voltages may permit meter control board 17 to use only one calibration coefficient for a plurality of operating voltages, as compared to known utility meters, which require multiple calibration coefficients for use at different voltages. Moreover, the reduction in capacitance between coil 104 and conductor 14 not only facilitates reducing and/or simplifying the calibration processes, but also facilitates reducing manufacturing cost, resources, and/or time with at least the same and often improved accuracy across operating voltage/current ranges.

As shown in FIG. 3, in this exemplary embodiment, sensor device 12 includes an enclosure 112. Enclosure 112 may be formed from a variety of materials and/or through a variety of fabrication processes. In the exemplary embodiment, enclosure 112 includes substantially only dielectric material 108, such that dielectric material 108 is positioned about coil 104, opposite aperture 110. As such, when used within utility meter 10 having three-phase conductors 14, 15, and 16, sensor device 12 may be positioned about conductors 14 and proximate to at least one other conductor 15 (as shown in FIG. 1), and potentially proximate to conductor 16. Similar to the interaction between coil 104 and conductor 14, a capacitance exists between coil 104 and conductor 15, which may adversely affect and/or degrade the accuracy of sensor device 12. Due to the position of dielectric material 108 opposite aperture 110, dielectric material 108 is positioned between coil 104 and adjacent conductor 15. Accordingly, dielectric material 108 is further provided to reduce capacitance between coil 104 and conductor 15. In this manner, sensor device 12 may provide improved accuracy when used in utility meter 10 having multiple conductors and/or when used in close proximity to one or more other conductors, as compared to known air-gap coils.

In some embodiments, enclosure 112 may include one or more materials in addition to dielectric material 108, such as non-dielectric materials or dielectric materials that have different characteristics. In one embodiment, enclosure 112 includes dielectric material 108 and an additive material, which is provided to support dielectric material 108 in one or more locations relative to coil 104 to enable it to perform as described herein. The additive material may include plastic materials, thermoplastic materials, thermoset materials, ceramic materials, metallic materials, wood materials, clay materials, organic materials, any mixture thereof, and/or other suitable materials. The additive material may be selected based on manufacturing techniques, dimensional stability, cost, moldability, workability, rigidity, and/or other characteristics of the material, etc. In such embodiments, when dielectric material 108 is a higher cost material (as compared to the additive material), the inclusion of an additive material may reduce the overall cost of sensor device 12. Further, one or more additive materials may be used to perform one or more additional functions, such as supporting dielectric material 108, protecting and/or insulating coil 104, etc. As should be apparent, the additive material may be used as part of enclosure 112 in various embodiments. In the exemplary embodiment, however, an additive material is omitted, as enclosure 112 substantially only includes dielectric material 108.

Enclosure 112 may be fabricated from the dielectric material, formed integrally from dielectric material 108 and at least one additive material, or assembled from separate dielectric material(s) 108 and additive material(s). Enclosure 112 and/or dielectric material 108 may be fabricated using one or more injection molding processes and/or other suitable fabrication processes. In the exemplary embodiment, enclosure 112 is constructed via a single injection molding process, in which dielectric material 108 is injected into a mold structured to form enclosure 112.

Alternatively, enclosure 112 may be constructed from a multi-stage injection molding process. In a multi-stage process, an additive material is molded into a specific shape through an initial molding process. Subsequently, the molded additive material is positioned within a mold, and dielectric material 108 is injected into the mold. Dielectric material 108 flows into voids defined between the mold and/or the additive material, to form enclosure 112 from dielectric material 108 and additive material. In various embodiments, a multi-stage molding process may permit a relatively high-cost dielectric material to be specifically positioned relative to coils 104 such that desired performance as described herein is achieved, while still permitting other portions of enclosure 112 to be constructed from one or more relatively low cost materials.

It should be appreciated that enclosure 112 may be constructed by other fabrication techniques to provide dielectric material 108 throughout or at desired positions relative to coil 104 and/or conductor 14. In one example, dielectric material 108 is constructed separately from an additive material, and subsequently transformed and/or constructed with the additive material to form enclosure 112. In yet another example, a tubular dielectric material may be inserted into an aperture formed by an additive material to form enclosure 112.

In the exemplary embodiment, enclosure 112 includes a mount 116 that defines aperture 110. When conductor 14 is received in aperture 110 (as shown in FIG. 3), air-gap 106 is formed between mount 116 and conductor 14. Simultaneously, a friction fit is created between mount 116 and conductor 14. Mount 116 may include dielectric material 108 and/or another material. It should be appreciated that mount 116 may be formed in a variety of different shapes that are designed to receive and/or couple to various types, shapes, and/or orientations of conductors. In at least one embodiment, mount 116 defines an aperture that is structured to form a friction fit with a rectangular-shaped bus bar conductor.

Referring again to FIG. 2, enclosure 112 includes a first portion 118 and a second portion 120. First portion 118 is releasably coupled to second portion 120 such that substrate 102 and coil 104 are substantially enclosed therein. Specifically, when assembled, as shown in FIG. 3, first portion 118 is coupled to second portion 120 through at least one ship-lap joint to form enclosure 112. It should be appreciated that first portion 118 and second portion 120 may be coupled together through a variety of different methods, including, without limitation, one or more butt joints, screw joints, hinge joints, tab-slot arrangements, tongue-and-groove arrangements, fasteners, etc. While enclosure 112 has generally toroidal shape, as shown in FIG. 3, it should be appreciated that other enclosure embodiments may define any shape and/or size, that is sized and/or operates to at least partially enclose substrate 102, coil 104 and/or shields, and that enables dielectric material 108 to perform as described herein.

Further, in the exemplary embodiment, the thickness of dielectric material 108 varies throughout enclosure 112. The ship-lap joint between first portion 118 and second portion 120 provides an overlap of first portion 118 and second portion 120. Specifically, in this exemplary embodiment, first portion 118 and second portion 120 each have a thickness of about 1.2 millimeters at aperture 110. When the first portion 118 and the second portion 120 are assembled, first portion 118 and second portion 120 at least partially overlap at the ship-lap joint (along aperture 110) to create a total thickness of about 2.4 millimeters. Moreover, in this exemplary embodiment, first portion 118 and second portion 120 are structured such that the total thickness about the outside of enclosure 112 at a minor ship-lap joint (opposite aperture 110) is less than about 1.2 millimeters. It should be appreciated that various methods of forming enclosure 112 may be used to provide one or more different thicknesses of enclosure 112 and/or dielectric material 108.

In various other embodiments, the thickness of enclosure 112 and/or dielectric material 108 may be between about 0.5 millimeters and about 3.0 centimeters. In some embodiments, one or more thicknesses of enclosure 112 and/or dielectric material 108 are between about 1.0 millimeters and 6.0 millimeters. Further, in various embodiments, one or more thicknesses of enclosure 112 and/or dielectric material 108 are between about 1.0 millimeters and 4.0 millimeters. It should be appreciated that enclosure 112 and/or dielectric material 108 may have different thickness in other embodiments, potentially based on a method of assembly/fabrication, the characteristic(s) of a selected dielectric material, and/or desired performance characteristic(s). Further, other shapes, sizes, and/or joints for enclosure 112 may be used to at least partially enclosure coil 104, while positioning dielectric material 108 relative to coil 104 to perform consistent with one or more aspects of the present disclosure.

In the exemplary embodiment, coil 104 includes an exemplary Rogowski coil. It should be appreciated, however, that sensor device 12 may include a coil other than a Rogowski coil. Further, aspects of the present disclosure are not limited to only being used with a Rogowski coil as described and illustrated herein.

Figure 5:
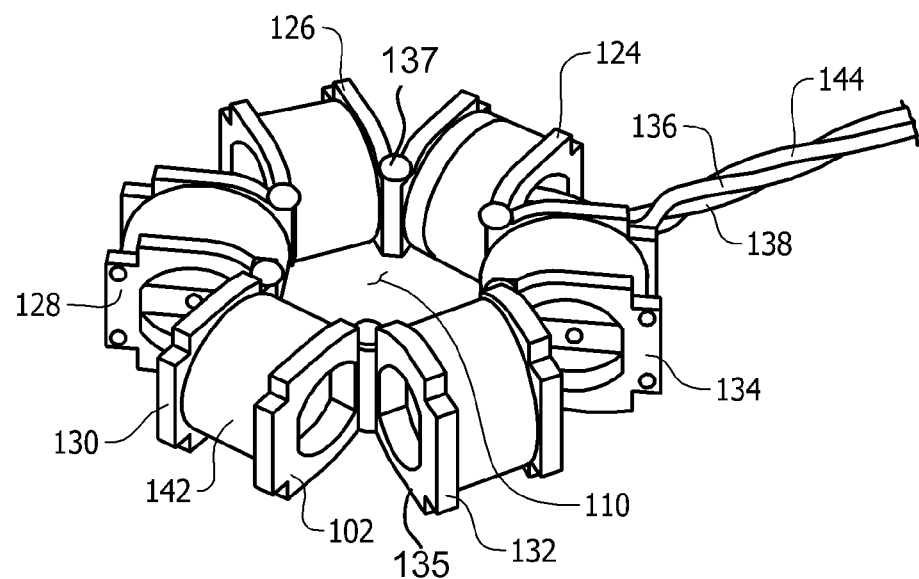
FIG. 5 is a perspective view of an exemplary substrate and coil used with the sensor device shown in FIG. 1.

FIG. 5 is a perspective view of substrate 102 and coil 104 separated from enclosure 112. In the exemplary embodiment, substrate 102 includes six bobbins 124, 126, 128, 130, 132, and 134 (collectively referred to as bobbins 124-134). Each bobbin 124-134 has a substantially circular cross-section, and more particular, is a right cylinder that includes flanges 135 at opposite ends that retain coil 104. In other embodiments, substrate 102 may have a different number, shape, and/or size of bobbins. For example, substrate 102 may include five bobbins, eight bobbins, ten bobbins, thirty bobbins, or another even or odd number of bobbins. Further, substrate 102 may include bobbins having a different shape, and/or an ovular cross-section, an elliptical cross-section, or rectangular cross-section, etc. In still other embodiments, substrate 102 may include a different structure for supporting coil 104, in addition to or other than flanges 135. In at least one embodiment, coil 104 is sufficient rigid to omit substrate 102.

In the exemplary embodiment, bobbins 124-134 are coupled together via hinged joints 137. More specifically, bobbins 124 and 126 are hingedly coupled to permit pivotal movement therebetween. In various embodiments, bobbins 124-134 may be linearly aligned to enable efficient winding of coil 104 and/or pivoted relative to one another to form a substantially circular shape, as illustrated in FIG. 5.

Each of bobbins 124-134 of substrate 102 is a non-magnetic structure, such that bobbins 124-134 are constructed from one or more non-magnetic materials, including, for example, thermoplastic material, ceramic material, wood, material, or other kinds of suitable material(s). In this exemplary embodiment, each of bobbins 124-134 is fabricated from a dielectric material, potentially consistent with dielectric material 108. By use of a non-magnet substrate 102, cost savings may be realized over known sensor devices that include one or more magnetic cores. Moreover, in the exemplary embodiment, substrate 102 is shaped and/or sized to provide improved mounting within utility meter 10 and/or to a meter control board 17, as compared to known sensor devices that include bulky magnetic cores. Further, in this exemplary embodiment, bobbins 124-134 are formed separate from enclosure 112. It should be appreciated, however, that bobbins 124-134 may be formed integrally with and/or form one or more portions of enclosure 112 in other sensor device embodiments.

Figure 7:
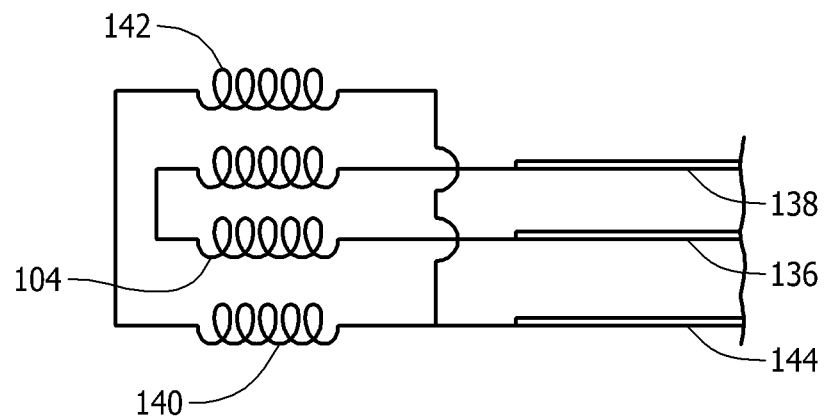
FIG. 7 is a circuit diagram of an exemplary coil and shields that may be used with the sensor device shown in FIG. 1.

In the exemplary embodiment, coil 104 is wound multiple turns on each bobbin 124-134. More specifically, in the exemplary embodiment, coil 104 includes a single magnet wire that enables coil 104 to be wound from bobbin 124 to bobbin 134 with several turns on each bobbin 124-134, and then wound back to bobbin 124 with additional turns on each bobbin 124-134. It should be appreciated that, in other embodiments, other different winding patterns on bobbins 124-134 may be used. Consistent with the above winding pattern across bobbins 124-134, a first end and a second end of coil 104 terminates at bobbin 124. The first end of coil 104 is terminated at lead wire 136, and the second end of coil 104 is terminated at lead wire 138, as shown in FIG. 7, described further below.

Figure 6:
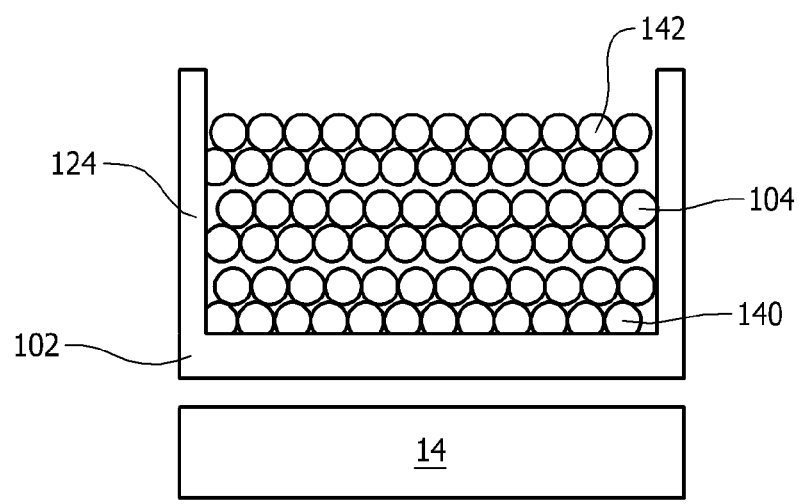
FIG. 6 is a cross-sectional view of an exemplary bobbin that may be used with the sensor device shown in FIG. 1.

In addition to coil 104, in the exemplary embodiment, one or more shields are applied to substrate 102. Specifically, FIG. 6 illustrates a partial cross-sectional view of sensor device 12 at bobbin 124. In the exemplary embodiment, bobbin 124 includes a first shield 140 and a second shield 142. First shield 140 is positioned between bobbin 124 and coil 104. Second shield 142 is positioned adjacent to coil 104 and opposite from first shield 140, such that coil 104 is positioned between first shield 140 and second shield 142. Each bobbin 124-134 includes substantially the same shield-coil-shield pattern as shown in FIG. 6. In other embodiments, bobbins 124-134 may include other winding patterns, including winding patterns, in which the winding pattern varies from one bobbin to another bobbin.

In the exemplary embodiment, each shield 140 and 142 provides a Faraday shield. More specifically, in this exemplary embodiment, first and second shields 140 and 142 behave substantially consistent with a Faraday cage, in order to facilitate reducing common mode noise on the sensor device 12 and/or to provide a low-pass filter for high frequency noise filtering. As a result, first and second shield 140 and 142 facilitate improved performance in the context of one or more industry standards for electromagnetic interface (EMI) and/or electromagnetic compatibility (EMC).

During fabrication, a plurality of turns of a magnet wire are wound on each bobbin 124-134 from bobbin 124 to bobbin 134 to form first shield 140. Coil 104 is then wound from bobbin 124 to bobbin 134 and back to bobbin 124 as described above. Subsequently, the magnet wire of first shield 140 is wound from bobbin 134 back to bobbin 124 with a plurality of turns on each bobbin 124-134 to form second shield 142. As such, in the exemplary embodiment, first shield 140 and second shield 142 are formed from a single magnet wire. The single magnet wire includes two ends, which may be terminated together, coupled to lead wire 138, and/or coupled to one or more additional lead wires, as described below. It should be appreciated that first shield 140 and second shield 142 may include any suitable materials, such as, without limitation, copper, aluminum or other non-ferrous conducting material. More generally, the shielding material may be formed as a sheet, a tape, a wire, a spray and/or any other form that enables bobbins 124-134 to include shields 140 and 142. As such, application of shields 140 and/or 142 may be formed, without limitation, via winding, wrapping, and/or spraying, for example. In various embodiments, first and second shield 140 and 142 may be formed separately from coil 104 and subsequently applied to coil 104.

Referring again to FIG. 5, sensor device 12 includes three lead wires 136, 138, and 144 extending therefrom. FIG. 7 illustrates a circuit diagram of the coupling of lead wires 136, 138, and 144. Specifically, in the exemplary embodiment, first and second shields 140 and 142 are formed from a single magnet wire, with each end coupled together and coupled to lead wire 144. Further, the first end of coil 104 (formed from a single magnet wire) is coupled to lead wire 136, and a second end of coil 104 is coupled to lead wire 138. As shown in FIG. 5, lead wires 136, 138, and 140 extend from enclosure 112 and form a twisted wire set. As such, lead wire 144 behaves as a low pass filter element to inhibit noise from first shield 140 and/or second shield 142 from being injected into a return path of the current signal provided by sensor device 12. The twisted wire set has a length of at least about 0.25 inches. In other embodiments, twisted wire set may have a length of at least about 1.0 inches, or a length of at least about 3.0 inches. In further embodiments, twisted wire set may have a length of at least about 6.0 inches. It should be appreciated that other lengths of lead wires and/or twisted wire sets may be employed in other sensor device embodiments, possibly based on the performance of the lead wire and/or twisted wire set to function as a filter to inhibit the injection of noise into a current signal transmitted from sensor device 12.

Figure 9:
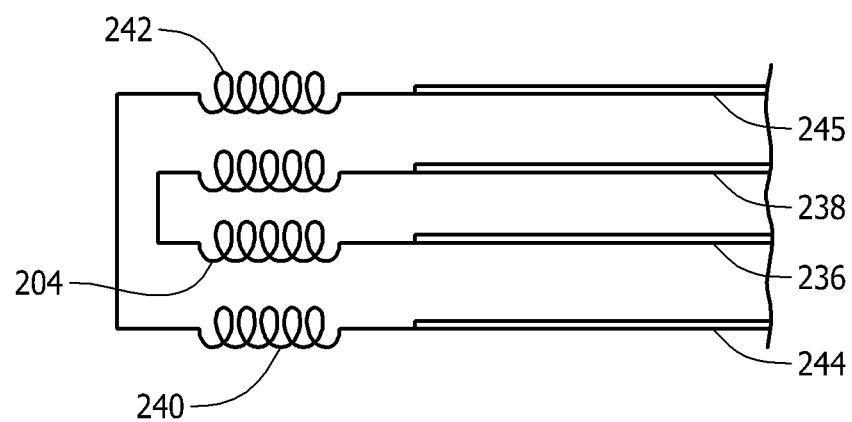
FIG. 9 is a circuit diagram of an exemplary coil and shields that may be used with the sensor device shown in FIG. 8.
Figure 8:
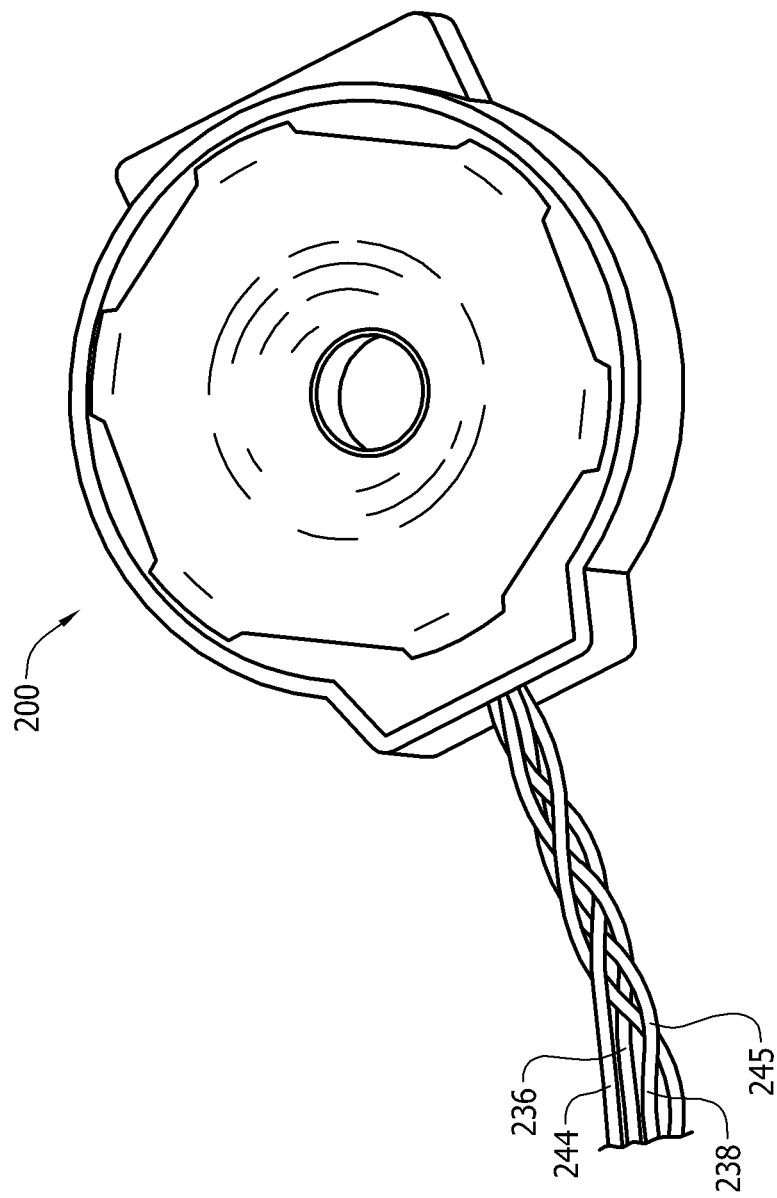
FIG. 8 is a perspective view of an exemplary sensor device including four lead wires.

FIGS. 8-9 illustrates another exemplary sensor device 200. In the exemplary embodiment, sensor device 200 includes a coil 204 and first and second shields 240 and 242, which are substantially consistent with coil 104 and shields 140 and 142 described above. Sensor device 200, however, includes four lead wires 236, 238, 244, and 245. Specifically, each end of the magnet wire forming first shield 240 and second shield 240 are coupled to separate lead wires 244 and 245 to create a filter element. Additionally, in this exemplary embodiment, two lead wires 236 and 238 coupled to coil 204 As illustrated in FIG. 8, lead wires 236, 238, 244, and 245 form a twisted wire set, which functions substantially consistent with the twisted wire set described above with reference to FIG. 5.

When coupled to meter control board 17, each lead wire 244 and 245 may be coupled together and coupled to lead wire 238. In some embodiments, twisted lead wires 244 and 245 may behave as a filter element. Additionally, or alternatively, a filter element may be coupled between lead wires 244 and 245 and lead wire 238. Such filter elements may include, without limitation, a resistor-capacitor circuit, an inductor-capacitor circuit, a resistor-inductor circuit, and/or a resistor-inductor-capacitor circuit.

Referring again to FIGS. 3 and 7, in yet another embodiment, each end of the magnet wire forming shields 140 and 142 may be coupled together and coupled to lead wire 138 (i.e., one end of coil 104), rather than a separate lead wire 144 In such an exemplary embodiment, sensor device 12 may include lead wires 136 and 138, while omitting lead wire 144, thereby providing a two-wire sensor device 12. In the exemplary embodiment, some noise from first shield 140 and/or second shield 142 may be injected into the return path of a current signal provided from sensor device 12, while providing sufficient accuracy and/or repeatability for a desired operating environment. In still other embodiments, lead wires may be omitted from a sensor device embodiment to provide for mounting on a circuit board, such as meter control board 17. In such an embodiment, a filter element may be provided by traces on meter control board 17, with a sufficient length to perform as described above with reference to lead wire 144. Additionally, or alternatively, filter element may include a resistor-capacitor circuit, an inductor-capacitor circuit, a resistor-inductor circuit, and/or a resistor-inductor-capacitor circuit, to inhibit noise from first shield 140 and/or second shield 142 from being injected into a return path for the current signal provided by sensor device 12.

In the exemplary embodiment, sensor device 12 is operational between about 10 Hz to about 1000 Hz, and is substantially immune to signals outside this range. More specifically, conductor 14 may act as an antenna to pick up radio frequency (RF) signals and re-radiate the unwanted noise to sensor device 12. First and second shield 140 and 142 perform as a low-pass filter to inhibit injection of noise signals to provide a high signal-to-noise-ratio (SNR) output. More particularly, first and second shields 140 and 142 reject re-radiated RF signal (and/or other noise signals) to provide a high SNR for the output of sensor device 12 when sensing low current through conductor 14. By reducing the effect of noise on current signals, the effective current sensing range of sensor device 12, within applicable standards, is broader, as compared to known sensor devices. In the exemplary embodiment, first and second shields 140 and 142 may permit one or more additional filter elements (for low and/or high current performance) to be omitted.

Moreover, first and second shields 140 and 142 substantially inhibit EMI from affecting the accuracy of sensor device 12. More specifically, first and second shields 140 and 142 facilitate inhibiting the effects of EMI sources positioned adjacent to sensor device 12, such as adjacent electronics and/or devices intended to interfere with the accuracy of sensor device 12 and/or utility meter 10. Additionally, by omitting a magnetic core, as compared to known sensors, sensor device 12 provides enhanced immunity to EMI affects on accuracy. As such, sensor device 12 provides a more robust and/or accurate current sensor device, as compared to other known sensor devices in the presence of one or more EMI sources.

Accuracy of sensor device 12 may be understood as a percentage of the actual value of current flowing through conductor 14. In the exemplary embodiment, sensor device 12 performs within about ±0.2% of the actual value in the range between about 2 amps and about 200 amps. More specifically, sensor device 12 performs within Class 0.2, 0.1A to 200A at an operating voltage of between about 60V and about 600V, more specifically at about 240V, within an accuracy of 0.2%. It should be appreciated that sensor device 12 consistent with one or more aspects of the present disclosure may conform to one or more different accuracy standards at different operating currents/voltages, possibly depending on the intended application and/or one or more accuracy requirements associated with the intended application.

Various methods are described herein for fabricating a sensor device for sensing current through a conductor. While these methods are described below with reference to sensor device 12, it should be understood that the methods are not limited to sensor device 12 and may be utilized to fabricate other sensor device embodiments. Likewise, sensor device 12 and sensor device 200 may be fabricated from methods other than those described below.

One exemplary method of fabricating sensor device 12 for sensing current through a conductor 14 includes providing coil 104 with a plurality of turns about non-magnetic substrate 102 and positioning dielectric material 108 adjacent to coil 104, such that when conductor 14 is disposed within aperture 110 defined by sensor device 12, dielectric material 108 is positioned between conductor 14 and coil 104. In several embodiments, the exemplary method may include at least partially and/or substantially enclosing coil 104 and/or substrate 102 within enclosure 112.

Another exemplary method of fabricating sensor device 12 for sensing current through conductor 14 includes providing Rogowski coil 104 and at least partially enclosing Rogowski coil 104 within dielectric material 108 such that, when Rogowski coil 104 is disposed about conductor 14, dielectric material 108 is disposed between Rogowski coil 104 and the conductor 14. Dielectric material 108 has a dielectric constant of greater than or equal to about 3.5. In several embodiments, the exemplary method may include assembling a first portion of an enclosure and a second portion of the enclosure with the Rogowski coil disposed therebetween to at least partially enclose the Rogowski coil. The enclosure includes the dielectric material. Additionally, or alternatively, the exemplary method may include forming the Rogowski coil on a substrate having a plurality of thermoplastic bobbins. Further, the exemplary method may include forming the plurality of thermoplastic bobbins from a dielectric material.

Yet another exemplary method of fabricating a sensor device 12 for sensing current through a conductor 14 includes winding a first shield of a magnet wire about each of a plurality of bobbins of a substrate, winding a coil about each of the plurality of bobbins of the substrate, and winding a second shield of magnet wire about each of the plurality of bobbins of the substrate.

Referring to sensor device 12 of FIG. 3, for example, the exemplary method may include coupling a first end and a second end of the magnet wire to a reference lead 144 of sensor device 12, coupling a first end of the coil to a first lead 136 of sensor device 12, and coupling a second end of the coil to a second lead 138 of sensor device 12. Further, the exemplary method may include at least partially enclosing the coil and the first and second shield within an enclosure, the enclosure comprising at least one dielectric material.

Another exemplary method of fabricating a sensor device 12 for sensing current through a conductor 14 includes providing sensor device 12 including non-magnetic substrate 102 defining aperture 110, coil 104 having a plurality of coil turns about at least a portion of non-magnetic substrate 102, first shield 140 disposed between each of substrate 102 and the plurality of coil turns, second shield 142 disposed proximate to the plurality of coil turns, opposite first shield 140. The exemplary method also includes coupling lead wire 144 to at least one of first shield 140 and second shield 142, coupling lead wire 136 to a first end of coil 104, coupling lead wire 138 to a second end of coil 104, and forming a twisted set of lead wires from lead wires 136, 138 and 144.

In various embodiment, coupling lead wire 144 to at least one of first shield 140 and second shield 142 includes coupling lead wire 144 to each of the first shield 140 and second shield 142. In other embodiments, coupling lead wire to at least one of first shield and second shield includes coupling lead wire 244 to first shield 140 and coupling a lead wire 245 to second shield 142.

One or more of the above described embodiments provide a highly-accurate sensor device. More specifically, the sensor devices, utility meters, and methods described herein may provide a highly-accurate sensor device that provides an expanded operating range with reduced calibration requirements over known coil sensors. For example, the disclosed dielectric material may provide reduced capacitance between a coil and one or more conductors, thereby providing improved accuracy across a range of currents and/or voltages. The improved accuracy may be realized with fewer calibration processes during manufacturing, resulting in reduced manufacturing cost and/or time. In another example, the disclosed shielding techniques provide improved rejection of EMI, originating from other electronics and/or tampering devices.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A sensor device for use in detecting current in a conductor, said sensor device comprising:
   a non-magnetic substrate defining an aperture structured to receive a conductor therein;
   a coil comprising a plurality of coil turns wound about at least a portion of said substrate;
   a first shield between said substrate and said plurality of coil turns;
   a second shield disposed proximate to the plurality of coil turns, opposite said first shield, such that said plurality of coil turns is disposed between said first shield and said second shield; and
   a filter element connected to at least one of the first and second shields.

2. The sensor device of claim 1, wherein the first shield and the second shield are formed from a single shield winding having a first end and a second end;
   wherein said filter element includes a first lead wire coupled to each of the first and second ends of the shield winding.

3. The sensor device of claim 2, wherein the coil includes a first end and a second end; and
   further comprising a second lead wire coupled to said first end of said coil and a third lead wire coupled to said second end of said coil.

4. The sensor device of claim 3, wherein the first, second and third lead wires form a twisted wire set.

5. The sensor device of claim 4, wherein said twisted wire set defines a length of at least about 1.0 inches.

6. The sensor device of claim 5, wherein said twisted wire set defines a length of at least about 6.0 inches.

7. The sensor device of claim 1, wherein said filter element includes a first lead wire coupled between the first shield and the coil and a second wire coupled between the second shield and the coil, the first and second wires forming a twisted set.

8. The sensor device of claim 7, wherein said twisted set defines a length of at least about 3.0 inches.

9. The sensor device of claim 8, wherein said twisted set defines a length of at least about 6.0 inches.

10. The sensor device of claim 1, wherein said filter element includes at least one of a resistor-capacitor circuit, an inductor-capacitor circuit, a resistor-inductor circuit, and a resistor-inductor-capacitor circuit.

11. A utility meter for use in transmitting electrical energy from a power source to a user; said utility meter comprising:
    a conductor; and
    a sensor device disposed at least partially around said conductor, said sensor device comprising a non-magnetic substrate defining an aperture, a coil including a plurality of coil turns wound about at least a portion of said non-magnetic substrate, a first shield between each of said substrate and said plurality of coil turns, a second shield proximate to said plurality of coil turns, opposite said first shield, and a filter element connected to said coil and at least one of the first and second shields.

12. The utility meter of claim 11, wherein the first shield and the second shield are formed from a single shield winding having a first end and a second end;
    wherein said filter element includes a first lead wire having a first end, the first end of the first lead wire coupled to each of the first and second ends of the shield winding.

13. The utility meter of claim 12, wherein the coil includes a first end and a second end; and
    further comprising a second lead wire coupled to said first end of said coil and a third lead wire coupled to said second end of said coil, said first, second and third lead wires forming a twisted wire set.

14. The utility meter of claim 13, wherein said twisted wire set defines a length of at least about 4.0 inches.

15. The utility meter of claim 11, wherein said filter element includes a first lead wire coupled between the first shield and the coil and a second wire coupled between the second shield and the coil, the first and second wires forming a twisted set defining a length of at least about 5.0 inches.

16. The utility meter of claim 15, further comprising a meter control board coupled to the sensor device, wherein the filter element is mounted to the meter control board and includes at least one of a resistor-capacitor circuit, an inductor-capacitor circuit, a resistor-inductor circuit, and a resistor-inductor-capacitor circuit.

17. The utility meter of claim 11, wherein the coil includes a Rogowski coil.

18. A method of fabricating a sensor device for sensing current through a conductor, the method comprising:
    providing a sensor device including a non-magnetic substrate defining an aperture, a coil having a plurality of coil turns about at least a portion of said non-magnetic substrate, a first shield disposed between each of the substrate and the plurality of coil turns, and a second shield disposed proximate to the plurality of coil turns, opposite the first shield; and
    coupling a first lead wire to at least one of the first shield and the second shield;
    coupling a second lead wire to a first end of the coil;
    coupling a third lead wire to a second end of the coil; and
    forming a twisted set of lead wires from the first, second, and third lead wires.

19. The method of claim 18, wherein coupling the first lead wire to at least one of the first shield and the second shield includes coupling the first lead wire to each of the first shield and the second shield.

* * * * *

UNITED STATES PATENT AND TRADEMARK OFFICE
CERTIFICATE OF CORRECTION

PATENT NO.        : 9,075,091 B2                                   Page 1 of 1
APPLICATION NO.   : 13/229002
DATED             : July 7, 2015
INVENTOR(S)       : Chamarti et al.

It is certified that error appears in the above-identified patent and that said Letters Patent is hereby corrected as shown below:

In Specification,
Column 8, line 48, delete "lead wires 136, 138, and 140" and insert therefor -- lead wires 136, 138, and 144 --.
Column 9, lines 2-3, delete "second shield 240" and insert therefor -- second shield 242 --.
Column 9, line 5, delete "204 As" and insert therefor -- 204. As --.

Signed and Sealed this
Twelfth Day of July, 2016

Michelle K. Lee
*Director of the United States Patent and Trademark Office*